(12) United States Patent
Gauss et al.

(10) Patent No.: US 6,198,288 B1
(45) Date of Patent: Mar. 6, 2001

(54) HIGH POWER, MULTIPLE-FREQUENCY TRANSMIT-RECEIVE SWITCH IN MAGNETIC RESONANCE IMAGING

(75) Inventors: Robert C. Gauss, Aurora; Michael Burl, Chagrin Falls, both of OH (US)

(73) Assignee: Picker International, Inc., Highland Heights, OH (US)

( * ) Notice: Subject to any disclaimer, the term of this patent is extended or adjusted under 35 U.S.C. 154(b) by 0 days.

(21) Appl. No.: 09/200,167

(22) Filed: Nov. 25, 1998

(51) Int. Cl.$^7$ .................................................. G01V 3/00
(52) U.S. Cl. ............................................. 324/322; 324/318
(58) Field of Search .................................. 324/322, 318, 324/300, 314, 307, 309

(56) References Cited

U.S. PATENT DOCUMENTS

| | | | |
|---|---|---|---|
| 4,075,552 | * 2/1978 | Traficante et al. | 324/322 |
| 4,763,076 | * 8/1988 | Arakawa et al. | 324/322 |
| 4,764,725 | 8/1988 | Misic et al. | 324/322 |
| 4,901,022 | * 2/1990 | Keren et al. | 324/322 |
| 5,144,240 | * 9/1992 | Mehdizadeh et al. | 324/318 |

* cited by examiner

*Primary Examiner*—Louis Arana
(74) *Attorney, Agent, or Firm*—Fay, Sharpe, Fagan, Minnich & McKee, LLP

(57) ABSTRACT

A magnetic imaging apparatus includes an RF coil (F) in electrical communication with an RF signal generator (C) and a receiver (G) through an interface circuit (E). The signal generator transmits resonance excitation signals at one of at least two resonance frequencies, e.g. the resonance frequencies of hydrogen helium 3, fluorine, phosphorous, carbon, or xenon. During the transmit cycle, PIN diode (30) is forward biased forming a filter at a first resonance frequency, electrically isolating the receiver from first frequency excitation signals. Simultaneously during the transmit cycle, PIN diode (32) is forward biased forming a filter at a second resonance frequency electrically isolating the receiver from second frequency excitation signals. During a receive cycle, the diodes are reverse biased turning both filters into low impedance circuits around the first and second resonance frequencies allowing a received magnetic resonance signal to pass unimpeded from the RF coil to the receiver.

17 Claims, 3 Drawing Sheets

HIGH POWER, MULTIPLE-FREQUENCY TRANSMIT-RECEIVE SWITCH IN MAGNETIC RESONANCE IMAGING

BACKGROUND OF THE INVENTION

The present invention relates to the art of radio frequency interface circuits. The invention finds particular application in interfacing between the transmission and reception of magnetic resonance signals and will be described with particular reference thereto. It is to be appreciated however, that the invention may find further application in other fields in which high power, multiple-frequency radio signals are alternately transmitted and received through a common antenna.

Heretofore, magnetic resonance imagers have commonly been used to generate images based on hydrogen nuclei in a subject. Typically, a radio frequency generator generates a high powered RF signal at the resonance frequency of hydrogen which is passed through an interface circuit to an RF coil. The generated RF signals induce magnetic resonance in the hydrogen in an imaged volume. During the passing of the excitation signals, the interface circuit uses quarter wavelength cables, other inductive and capacitive elements, and PIN diodes to create narrow, but effective bandpass filters at the resonance frequency. After excitation, the bias on the PIN diodes is changed such that the narrow bandpass filter becomes a low impedance interconnection between the RF coil and the receiver.

However, there are many paramagnetic nuclei of potential diagnostic interest, such as helium 3, fluorine, phosphorous, carbon, and xenon. At a given magnetic field strength, each of these nuclei have a distinctly different resonance frequency. More particularly, the resonance frequencies are sufficiently different that the bandpass filter of the interface circuit is ineffective for any but one of the selected frequencies.

The present invention provides a new, multiple-frequency transmit-receive switch which overcomes the above-mentioned difficulties and others.

BRIEF SUMMARY OF THE INVENTION

In accordance with the present invention, a magnetic resonance imaging apparatus for generating image representations of a volume of interest includes an RF signal generator for selectively generating one of a first transmit signal at a first transmit frequency and a second transmit signal at a second transmit frequency in accordance with a desired imaging profile. An RF coil is in electrical communication with the signal generator through an interface circuit. The RF coil transmits the transmit signal into an examination region thereby producing a magnetic resonance signal at a corresponding one of first and second resonance frequencies. An RF receiver is in electrical communication with the RF coil through the interface circuit, and receives the magnetic resonance signal. The interface circuit includes a first isolation circuit for selectively isolating the RF receiver from the transmit signals of the transmit frequency, and for selectively passing the magnetic resonance signals around the first frequency from the RF coil to the RF receiver. The interface circuit also includes a second isolation circuit for selectively isolating the RF receiver from the transmit signals of the second transmit frequencies and for selectively passing magnetic resonance signals around the second frequency from the RF coil to the RF receiver. An image reconstruction processor operatively connected with the RF receiver reconstructs the received resonance signals into an electronic image representation.

In accordance with another aspect of the present invention, the first isolation circuit includes a first PIN diode forming an effective short circuit between a first inductor and first capacitor in response to a forward bias. The first PIN diode forms an effective open circuit between the first inductor and first capacitor in response to a reverse bias. The reverse bias is associated with a receive cycle portion of the apparatus, and reduces the first isolation circuit to that of the first capacitor. The forward bias is associated with the transmit cycle portion of the apparatus and reduces the first isolation circuit to that of the first capacitor electrically parallel to the first inductor such that the first isolation circuit has a high impedance at the first transmit frequency.

In accordance with another aspect of the present invention, the second isolation circuit includes a second PIN diode forming an effective short circuit between a second capacitor and a second inductor in response to the forward bias. The second PIN diode forms an effective open circuit between the second capacitor and the second inductor in response to the reverse bias. The reverse bias is associated with the receive cycle and reduces the second isolation circuit to that of the second inductor. The forward bias is associated with the transmit cycle portion and reduces the second isolation circuit to that of the second conductor electrically parallel to the second capacitor, such that the second circuit has a high impedance at the second transmit frequency.

In accordance with another aspect of the present invention, the imaging apparatus includes a grounding PIN diode between the second isolation circuit and the RF receiver forming an effective short circuit between the RF receiver and ground in response to the forward bias.

In accordance with another aspect of the present invention, the imaging apparatus also includes a bandpass filter between the second isolation circuit and the RF receiver having a low impedance at the first and second magnetic resonance frequencies.

In accordance with another embodiment of the present invention, a high power, multiple-frequency transmit and receive interface circuit directs transmit signals at one of at least a first selected frequency and a second selected frequency from an RF source input to an RF coil node while isolating an RF receiver output. The interface circuit includes a first isolation circuit connected with the RF coil for selectively presenting a high impedance to the first frequency in a transmit mode and a low impedance to a first and second frequency in a receive mode. The interface circuit also includes a second isolation circuit connected between the first isolation circuit and the receiver output for selectively presenting a high impedance to the second frequency in the transmit mode and a low impedance to the first and second frequencies in the receive mode.

In accordance with another aspect of the present invention, the interface circuit further includes a source input isolation circuit connected between the RF source input and the RF coil for selectively presenting a high impedance to noise signals in the receive mode.

In accordance with another aspect of the present invention, the source input isolation circuit includes PIN diodes connected in series across a capacitor to ground. The PIN diodes selectively have a nonconductive state and a conductive state. An inductor is also provided in series with the diodes. In the conductive state of the PIN diodes, the PIN diodes, the inductor and the capacitor form a lowpass filter. In the nonconductive state of the PIN diodes, the diodes, the inductor and the capacitor form a voltage division between (1) of the diodes and the capacitor, and (2) the other of the diodes and the RF coil. The voltage division presents a high attenuation to a broad band noise signal from the RF source.

In accordance with the present invention, a method of magnetic resonance imaging in which radio frequency resonance excitation signals are generated at at least first and second frequencies includes during the excitation of resonance passing the radio frequency excitation signals substantially unattenuated from a signal generator to an RF coil. The method further includes electrically isolating a receiver from at least the first and second frequency signals.

In accordance with another aspect of the present invention, the method further includes chaining a bias on PIN diodes to change between (1) passing resonance signals at the first and second frequencies to the receiver during receiving of magnetic resonance signals, and (2) isolating the receiver from receiving the first and second frequency signals during the excitation of resonance.

One advantage of the present invention resides in the multiple-frequency operation of the switch.

Another advantage of the present invention resides in employment of discrete components rather than tuned length transmission lines.

Another advantage of the present invention resides in isolating transmitter power from the receiver during the transmit cycle.

Another advantage is that it facilitates multinuclear spectroscopy.

Other benefits and advantages of the present invention will become apparent to those skilled in the art upon a reading and understanding of the preferred embodiment.

BRIEF DESCRIPTION OF THE DRAWINGS

The invention may take physical form in certain parts and arrangements of parts and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
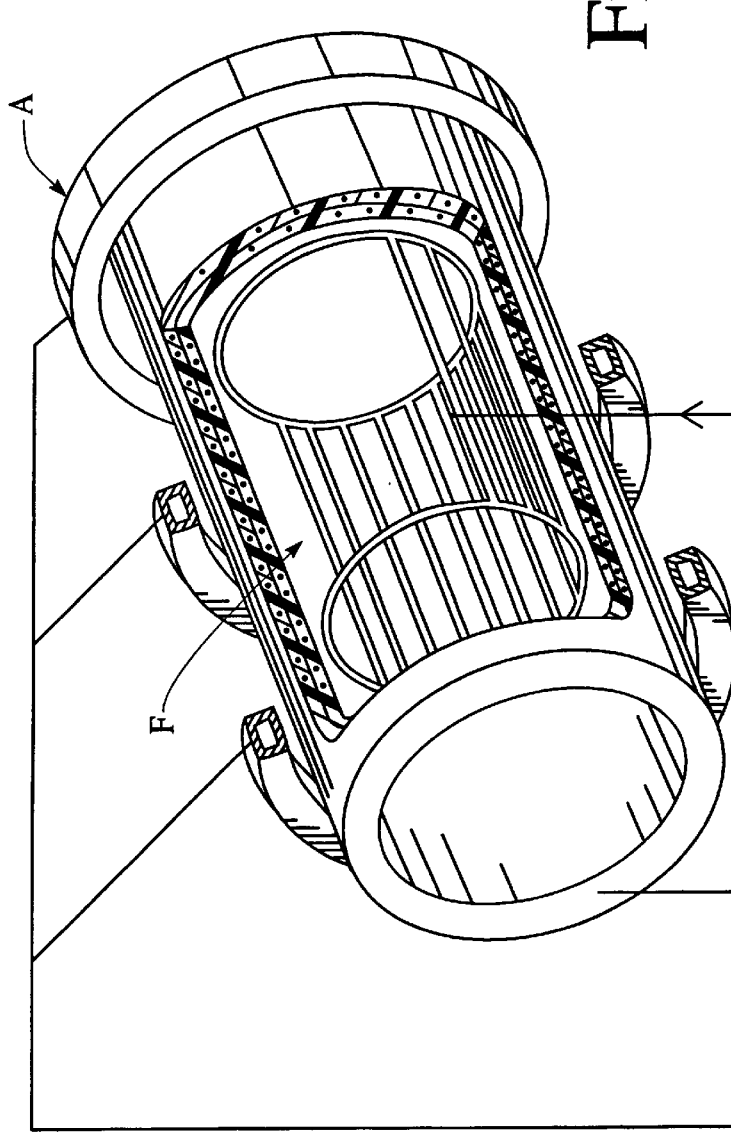
FIG. 1 is a diagrammatic illustration of a magnetic resonance imaging apparatus in accordance with the present invention.
Figure 1:
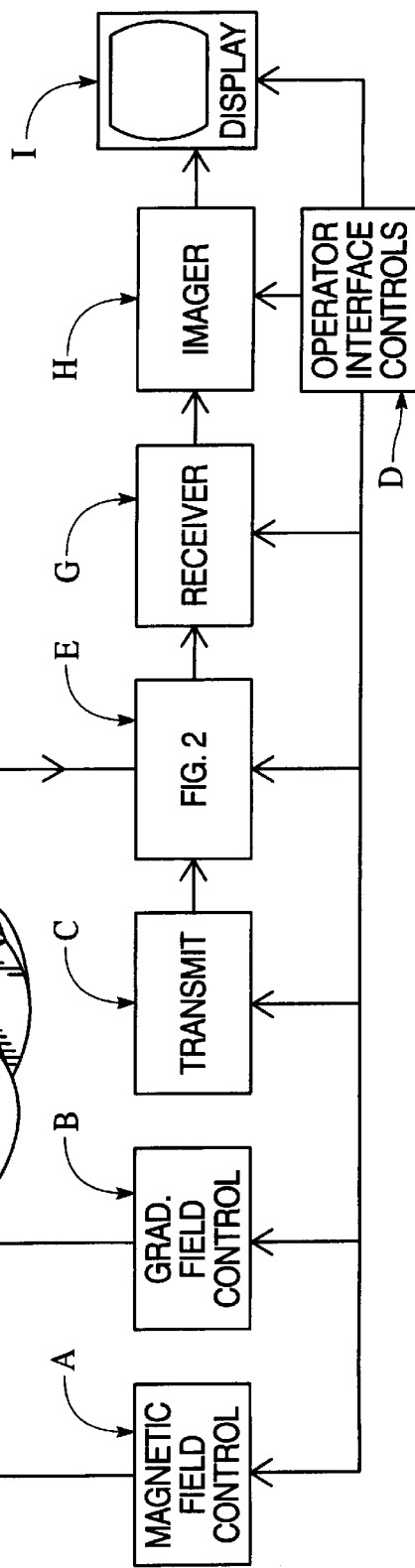

With reference to FIG. 1, a magnetic resonance imaging apparatus includes a main magnetic field generator A for establishing a temporally constant, main magnetic field longitudinally through an examination region. Gradient magnetic field control circuit and coils B selectively produce magnetic field gradients transversely across the main magnetic field of the image region. A magnetic resonance excitation generator, particularly an RF transmitter C, selectively transmits radio frequency resonance excitation and manipulation pulses during a transmit portion of each transmit/receive cycle. The RF transmitter C selects an appropriate transmit frequency based on a desired paramagnetic nuclei to be imaged as entered at an operator interface and controller D. The generated RF pulses are transmitted through an interface circuit E to an RF coil or antenna F. It is appreciated that antenna F could be a bird-cage coil, some elements from which have been omitted for illustration purposes only.

During a receive portion of each transmit/receive cycle, the RF coil F receives magnetic resonance signals from resonating nuclei in an imaged volume of a subject or sample within the examination region. The interface circuit E, which blocks passage of the RF signals to the receiver at the resonance frequencies of all imaged nuclei during transmit portions of the cycle, passes the RF signals received by the antenna F to a receiver G during receive portions of the cycle. An imager H, such as a two-dimensional Fourier transform imaging processor, reconstructs one or more electronic image representations from the received radio frequency resonance signals from the two or more imaged nuclei. Typically, the electronic images are representative of density, position, relaxation time, and other characteristics of the resonating nuclei in each voxel of the imaging volume. A video monitor or other display means I converts the electronic image representations to human readable images.

Figure 2:
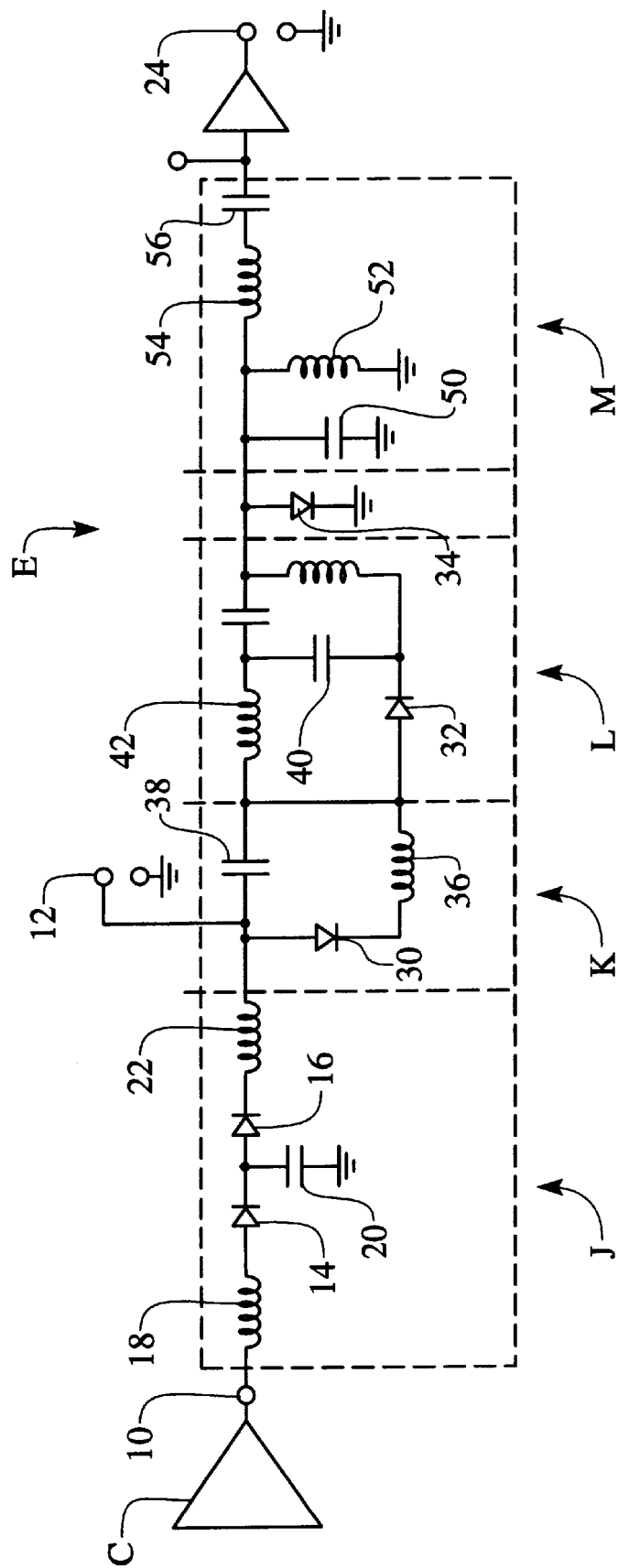
FIG. 2 is a circuit diagram of an interface circuit in accordance with the present invention.

Referring now to FIG. 2, the transmit signal from the RF signal generator C enters the interface circuit E at junction 10. Components in the path between input junction 10 and RF coil junction 12 comprise the transmitter to coil path. A PIN diode 14 and a PIN diode 16 are on, or forward biased during the transmit cycle portions and off, or reversed biased during the receive cycle portions. When biased on during the transmit cycle, the diodes 14, 16, along with an inductor 18, a capacitor 20, and an inductor 22 form a VHF low-pass filter J and pass all frequencies up to the cut-off frequency with low or no attenuation. On the other hand, when the diodes 14, 16 are biased off during the receive cycle portions, the diodes 14, 16 are equivalent to a small value of capacitance. In this case, a voltage is divided between the diode 14 and the capacitor 20 and between the diode 16 and the low impedance load on the junction 12 offering high attenuation to any low power broadband noise that might be coming from the RF transmitter C.

Figure 3:
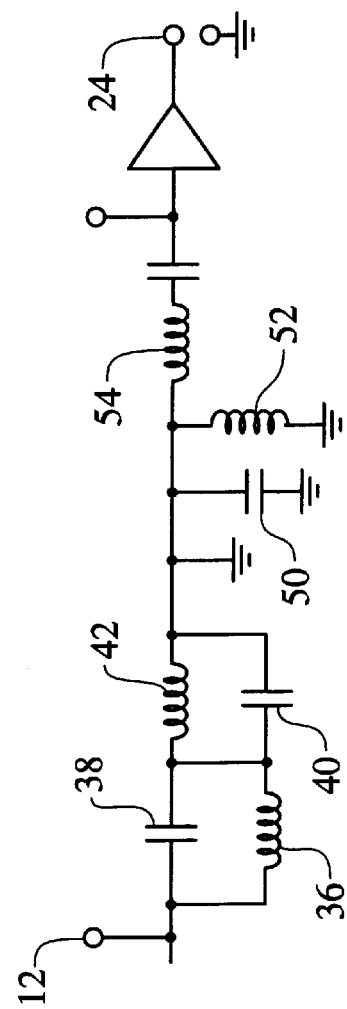
FIG. 3 is a circuit diagram of an equivalent circuit when the PIN diodes are forward biased.

The components in the path between the junction 12 and a junction 24 define a coil to receiver path. As above, PIN diodes 30, 32, 34 are on, or forward biased, during the transmit cycle portion and off, or reversed biased during the receive cycle position. When on in the transmit cycle portion, diode 30, an inductor 36, and a capacitor 38 form a high impedance parallel resonant circuit K at a first selected frequency corresponding to one of the RF transmitter C frequencies. This high impedance prevents transmit power at the first transmit frequency from flowing to the receiver G. Similarly, when on, or forward biased, the diode 32 along with a capacitor 40, and an inductor 42 form a second parallel resonant circuit L at a second selected transmit frequency of the RF signal generator C. One skilled in the art can appreciate that the first circuit K defined by the diode 30, the inductor 36, and the capacitor 38 is electrically in series with the second circuit L defined by the diode 32, the capacitor 40, and the inductor 42. This series connection presents a high impedance to the coil node or junction 12 at both transmit frequencies. Transmit power is thus blocked from being delivered to the receiver port or junction 24. The diode 34 offers additional receiver protection by shorting to ground any small value of transmit power that may have passed through the two tuned circuits. An equivalent circuit, corresponding to the diodes being forward biased, is shown in FIG. 3 where like components are referenced with like numerals.

When the diodes are in the off state during a receive cycle, the diode 30 effectively removes the inductor 36 from the first filter circuit K, and the diode 32 effectively removes the capacitor 40 from the second filter circuit L. The equivalent circuit, shown by reference to FIG. 4, leaves capacitor 38 and inductor 42 in series to resonate at a frequency between the two parallel resonance frequencies of the transmit cycle portion. Signals at or near this intermediate frequency can pass with low attenuation (i.e. from the coil F to the receiver G). Those skilled in the art can appreciate that the operating Q of this circuit E can be quite low and wide band operation is possible. In circuitry beyond the junction 24, frequency selective preamplifiers (not shown) may be selected by low level PIN diode switches of the conventional design.

Figure 4:
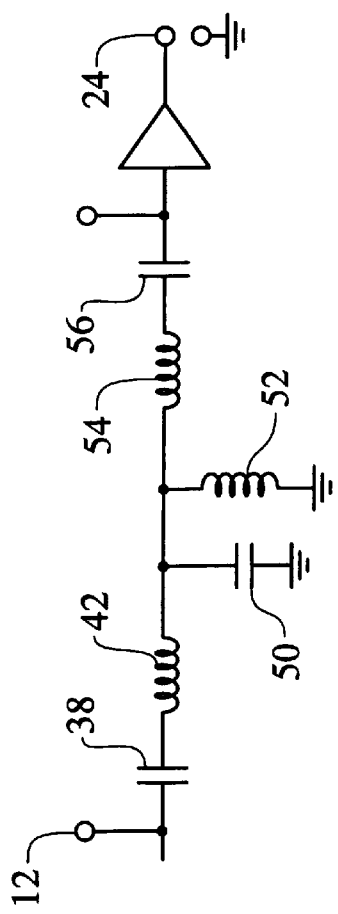
FIG. 4 is an equivalent circuit diagram of the interface circuit when the PIN are reverse biased.

Cross referencing FIGS. 2 and 4, the series tuned first and second filter circuits L, K can be used in narrow band applications connected directly to a preamplifier at the receiver junction 24. A preferred embodiment uses the first and second filter M circuits K, L as the input stage to a third bandpass filter defined by a capacitor 50, an inductor 52, an inductor 54, and a capacitor 56. This allows a much wider spread of frequencies without requiring the capacitor 38 and the inductor 42 to define very low values of reactance.

Those skilled in the art can now appreciate that this interface circuit E can be modified to perform over three or more separate transmit frequencies by using these three or more parallel tuned filter circuits in series. It is appreciated that during the receive cycle, the interface circuit E reduces to a single tuned circuit as the input to the receiver G. For efficient use of a DC biasing current, all the PIN diodes are connected in series along a DC path. However, this is not necessary for proper operation of the circuit and alternate diode DC driving circuits are possible.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiment, the invention is now claimed to be:

1. An image apparatus comprising:
    an RF signal generator for selectively generating one of a first transmit signal with a first transmit frequency spectrum and a second transmit signal with a second transmit frequency spectrum;
    an RF coil in electrical communication with the RF signal generator through an interface circuit, the RF coil transmitting the transmit signals into a volume of interest thereby exciting a corresponding one of first and second species of nuclei in the volume to resonate producing magnetic resonance signals in a corresponding one of first and second resonance frequency spectrums; and,
    an RF receiver in electrical communication with the RF coil through the interface circuit, the RF receiver receiving the magnetic resonance signals;
    the interface circuit including:
        a first isolation circuit for selectively electrically isolating the RF receiver from transmit signals in the first transmit frequency spectrum, and for selectively electrically passing the magnetic resonance signals in the first frequency spectrum from the RF coil to the RF receiver; and,
        a second isolation circuit for selectively electrically isolating the RF receiver from the transmit signals in the second transmit frequency spectrum, and for selectively electrically passing the magnetic resonance signals in the second frequency spectrum from the RF coil to the RF receiver; the first isolation circuit including:
            a first PIN diode forming an effective short circuit between a first inductor and a first capacitor in response to a forward bias, and forming an effective open circuit between the first inductor and the first capacitor in response to a reverse bias, the reverse bias being associated with a receive cycle portion of the apparatus and reducing the first isolation circuit to that of the first capacitor, and the forward bias being associated with a transmit cycle portion of the apparatus and reducing the first isolation circuit to that of the first capacitor electrically parallel to the first inductor such that the first isolation circuit has a high impedance at the first transmit frequency spectrum.

2. The imaging apparatus as set forth in claim 1 where the second isolation circuit includes:
    a second PIN diode forming an effective short circuit between a second capacitor and a second inductor in response to the forward bias, and forming an effective open circuit between the second capacitor and the second inductor in response to the reverse bias, the reverse bias being associated with the receive cycle portion and reducing the second isolation circuit to that of the second inductor, and the forward bias being associated with the transmit cycle portion and reducing the second isolation circuit to that of the second inductor electrically parallel to the second capacitor, such that the second circuit has a high impedance at the second transmit frequency.

3. The imaging apparatus as set forth in claim 2 wherein the first isolation circuit is electrically in series with the second isolation circuit thereby selectively presenting one of:
    (1) a high impedance to the RF generator at both the first and second transmit frequencies and substantially isolating the RF receiver from the transmit signals in response to the forward bias, and
    (2) a low impedance to the RF coil at the first and second magnetic resonance frequencies substantially passing the magnetic resonance signals to the RF receiver in response to the reverse bias.

4. The imaging apparatus as set forth in claim 3 further including:
    a grounding PIN diode between the second isolation circuit and the RF receiver forming an effective short circuit between the RF receiver and ground in response to the forward bias.

5. The imaging apparatus as set forth in claim 3 further including:
    a bandpass filter between the second isolation circuit and the RF receiver having low attenuation at the first and second magnetic resonance frequencies.

6. An imaging apparatus comprising:
    an RF coil in electrical communication with an RF signal generator, the RF coil transmitting a transmit signal thereby exciting a corresponding one of first and second nuclei to resonate producing magnetic resonance signals in a corresponding one of first and second resonance frequency spectra;
    an RF receiver in electrical communication with the RF coil which receives the magnetic resonance signals;

an interface circuit including:
- a first isolation circuit for selectively electrically isolating the RF receiver from transmit signals in a first transmit frequency spectrum, and for selectively electrically passing the magnetic resonance signals in the first frequency spectrum from the RF coil to the RF receiver; and,
- a second isolation circuit for selectively electrically isolating the RF receiver from transmit signals in a second transmit frequency spectrum, and for selectively electrically passing the magnetic resonance signals in the second frequency spectrum from the RF coil to the RF receiver; and,
- a network electrically connected between the RF signal generator and the RF coil, the network including:
  switch PIN diodes and a reactive element which forms a low pass filter in response to a forward bias, and forming an effective open circuit between the RF signal generator and the RF coil in response to a reverse bias.

7. An interface circuit without quarter wavelength cables for selectively isolating components in a magnetic resonance imaging apparatus including an RF signal generator adapted to selectively generate one of at least three transmit signals, an RF coil, and an RF receiver, the interface circuit comprising:
- a first isolation circuit for isolating the RF receiver from a first transmit signal with a first frequency during a transmit cycle portion and passing detected magnetic resonance signals responsive to the first signal from the RF coil to the RF receiver during a receive cycle portion;
- a second isolation circuit for isolating the RF receiver from a second transmit signal with a second frequency during the transmit cycle portion and passing detected magnetic resonance signals responsive to the first and second signals from the RF coil to the RF receiver during the receive cycle portion; and,
- a third isolation circuit for isolating the RF receiver from a third transmit signal with a third frequency during the transmit cycle portion and passing detected magnetic resonance signals responsive to the first, second and third signals from the RF coil to the RF receiver during the receive cycle portions.

8. A high power multiple frequency transmit and receive interface circuit which (1) directs transmit signals at one of at least a first selected frequency and a second selected frequency from an RF source input to an RF coil node while isolating an RF receiver output from the RF coil node and the RF source input in a transmit mode, and which (2) directs signals around at least the first and second frequencies from the RF coil node to the receiver output in a receive mode, the interface circuit comprising:
- a first isolation circuit connected with the coil node for selectively presenting a high impedance to the first frequency in the transmit mode and a low impedance to the first and second frequencies in the receive mode;
- a second isolation circuit connected between the first isolation circuit and the receiver output for selectively presenting a high impedance to the second frequency in the transmit mode and a low impedance to the first and second frequencies in the receive mode; and,
- a bandpass filter connected between the second isolation circuit and the RF receiver output.

9. The transmit and receive interface circuit as set forth in claim 8 further including:
- a grounding PIN diode connected at one end between the second isolation circuit and the receiver output and connected at another end with ground to form an effective short circuit to ground in response to a forward bias, the forward bias being applied in the transmit mode.

10. The transmit and receive interface circuit as set forth in claim 8 where the first isolation circuit includes:
- a first PIN diode selectively having a substantially non-conductive state and a substantially conductive state, a capacitive element and an inductive element;
- the first isolation circuit being equivalent to a capacitor when the PIN diode is biased to the substantially non-conductive state and being electrically equivalent to a capacitive-inductive tank circuit presenting a high impedance to the first frequency when the PIN diode is in the substantially conductive state.

11. The transmit and receive interface circuit as set forth in claim 8 wherein the second isolation circuit includes:
- a second PIN diode selectively having a substantially non-conductive state and a substantially conductive state, a capacitive element, and an inductive element;
- the second isolation circuit being equivalent to an inductor when the PIN diode is in the substantially non-conductive state and being electrically equivalent to a capacitive inductive tank circuit presenting a high impedance to the second frequency when the PIN diode is in the substantially conductive state.

12. A high power multiple frequency transmit and receive interface circuit which (1) directs transmit signals at one of at least a first selected frequency and a second selected frequency from an RF source input to an RF coil node while isolating an RF receiver output from the RF coil node, and the RF source input in a transmit mode and which (2) directs signals around at least the first and second frequencies from the RF coil node to the receiver output in a receive mode, the interface circuit comprising:
- a source input isolation circuit connected between the RF source input and the RF coil node for selectively presenting a high impedance to noise signals in the receive mode, the source input isolation circuit including:
  - PIN diodes in series across a capacitor to ground, the PIN diodes selectively having a substantially non-conductive state and a substantially conductive state; and
  - an inductor in series with the diodes;
  - such that in the conductive state of the PIN diodes, the PIN diodes, the inductor and the capacitor form a low pass filter; and,
  - such that in the non-conductive state of the PIN diodes, the PIN diodes, the inductor and the capacitor form a voltage division between (1) one of the diodes and the capacitor, and (2) the other of the diodes and the RF coil node; the voltage division presenting a high attenuation to a signal from the RF source.

13. A method of magnetic resonance imaging in which a temporally constant magnetic field is generated through an examination region, at least first and second wavelength independent radio frequency resonance excitation signals are generated, the first frequency signals are transmitted into the examination region to induce a magnetic resonance in a first species of nuclei which generate first magnetic resonance signals around the first frequency; and the second frequency signals are transmitted into the examination region to induce a second species of nuclei to resonate and generate second magnetic resonance signals around the second frequency, the induced first and second magnetic resonance signals being received by an RF coil and processed into at least one electronic image representation, the method further including:

during transmission of the radio frequency resonance excitation signals:
(a) passing the radio frequency resonance excitation signals substantially unattenuated from a signal generator to the RF coil; and,
(b) electrically isolating a receiver from at least the first and second wavelength independent radio frequency resonance excitation signals.

14. The method of magnetic resonance imaging as set forth in claim 13, further including:

during receiving of the magnetic resonance signals by the RE coil:
(a) electrically isolating from the receiver any broadband noise signal from the signal generator; and,
(b) passing from the RF coil to the receiver the received magnetic resonance signal substantially unattenuated.

15. The method of magnetic resonance imaging as set forth in claim 14, further comprising:

short circuiting to ground the receiver during the transmission of the radio frequency resonance excitation signals.

16. The method as set forth in claim 13 further including:

chaining a bias on PIN diodes to change between (1) passing resonance signals around the first and second frequencies to the receiver during receiving of magnetic resonance signals and (2) isolating the receiver from receiving the first and second frequency signals during the transmission of the radio frequency resonance excitation signals.

17. The method as set forth in claim 13, wherein wavelengths of the first and second wavelength independent excitation signals comprise other than integer multiples of quarter wavelengths.

* * * * *